(12) United States Patent
Chen et al.

(10) Patent No.: US 8,711,598 B1
(45) Date of Patent: Apr. 29, 2014

(54) MEMORY CELL AND MEMORY CELL ARRAY USING THE SAME

(71) Applicant: United Microelectronics Corporation, Hsinchu (TW)

(72) Inventors: Hsin-Wen Chen, Kaohsiung (TW); Chi-Chang Shuai, Hsinchu (TW); Shih-Chin Lin, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 29 days.

(21) Appl. No.: 13/682,742

(22) Filed: Nov. 21, 2012

(51) Int. Cl.
*G11C 5/06* (2006.01)

(52) U.S. Cl.
USPC .............. 365/72; 327/434; 365/154; 438/233

(58) Field of Classification Search
CPC ...... G11C 5/025; G11C 7/18; G11C 11/4097; G11C 11/412; H01L 27/11
USPC ............................ 365/72, 154, 222, 203, 189
See application file for complete search history.

(56) References Cited

U.S. PATENT DOCUMENTS

| | | |
|---|---|---|
| 3,663,828 A | 5/1972 | Low |
| 3,818,402 A | 6/1974 | Golaski |
| 4,163,944 A | 8/1979 | Chambers |
| 4,245,355 A | 1/1981 | Pascoe |
| 4,409,608 A | 10/1983 | Yoder |
| 4,816,784 A | 3/1989 | Rabjohn |
| 5,159,205 A | 10/1992 | Gorecki |
| 5,208,725 A | 5/1993 | Akcasu |
| 5,212,653 A | 5/1993 | Tanaka |
| 5,406,447 A | 4/1995 | Miyazaki |
| 5,446,309 A | 8/1995 | Adachi |
| 5,583,359 A | 12/1996 | Ng |
| 5,637,900 A | 6/1997 | Ker |
| 5,760,456 A | 6/1998 | Grzegorek |
| 5,808,330 A | 9/1998 | Rostoker |
| 5,923,225 A | 7/1999 | De Los Santos |
| 5,959,820 A | 9/1999 | Ker |
| 6,008,102 A | 12/1999 | Alford |
| 6,081,146 A | 6/2000 | Shiochi |
| 6,172,378 B1 | 1/2001 | Hull |
| 6,194,739 B1 | 2/2001 | Ivanov |
| 6,246,271 B1 | 6/2001 | Takada |
| 6,285,578 B1 | 9/2001 | Huang |
| 6,291,872 B1 | 9/2001 | Wang |
| 6,370,372 B1 | 4/2002 | Molnar |
| 6,407,412 B1 | 6/2002 | Iniewski |
| 6,413,811 B1 * | 7/2002 | Masuoka ...................... 438/233 |

(Continued)

*Primary Examiner* — Huan Hoang
*Assistant Examiner* — Muhammad Islam
(74) *Attorney, Agent, or Firm* — Ding Yu Tan

(57) ABSTRACT

A memory cell includes six transistors. The first and second P-type transistors have the sources coupled to a first voltage. The first and second N-type transistors have the drains coupled to drains of the first and second P-type transistors, respectively; the sources coupled to a second voltage; and the gates coupled to gates of the first and second P-type transistors, respectively. The third N-type transistor has the drain coupled to a write word line; the source coupled to drain of the first N-type transistor and gate of the second N-type transistor; and the gate coupled to a first write bit line. The fourth N-type transistor has the drain coupled to the write word line; the source coupled to drain of the second N-type transistor and gate of the first N-type transistor; and the gate coupled to a second write bit line. A memory cell array is also provided.

16 Claims, 6 Drawing Sheets

(56) References Cited

U.S. PATENT DOCUMENTS

| | | |
|---|---|---|
| 6,427,226 B1 | 7/2002 | Mallick |
| 6,448,858 B1 | 9/2002 | Helms |
| 6,452,442 B1 | 9/2002 | Laude |
| 6,456,221 B2 | 9/2002 | Low |
| 6,461,914 B1 | 10/2002 | Roberts |
| 6,480,137 B2 | 11/2002 | Kulkarni |
| 6,483,188 B1 | 11/2002 | Yue |
| 6,486,765 B1 | 11/2002 | Katayanagi |
| 6,509,805 B2 | 1/2003 | Ochiai |
| 6,518,165 B1 | 2/2003 | Yoon |
| 6,521,939 B1 | 2/2003 | Yeo |
| 6,545,547 B2 | 4/2003 | Fridi |
| 6,560,306 B1 | 5/2003 | Duffy |
| 6,588,002 B1 | 7/2003 | Lampaert |
| 6,593,838 B2 | 7/2003 | Yue |
| 6,603,360 B2 | 8/2003 | Kim |
| 6,608,363 B1 | 8/2003 | Fazelpour |
| 6,611,223 B2 | 8/2003 | Low |
| 6,625,077 B2 | 9/2003 | Chen |
| 6,630,897 B2 | 10/2003 | Low |
| 6,639,298 B2 | 10/2003 | Chaudhry |
| 6,653,868 B2 | 11/2003 | Oodaira |
| 6,668,358 B2 | 12/2003 | Friend |
| 6,700,771 B2 | 3/2004 | Bhattacharyya |
| 6,720,608 B2 | 4/2004 | Lee |
| 6,724,677 B1 | 4/2004 | Su |
| 6,756,656 B2 | 6/2004 | Lowther |
| 6,795,001 B2 | 9/2004 | Roza |
| 6,796,017 B2 | 9/2004 | Harding |
| 6,798,011 B2 | 9/2004 | Adan |
| 6,810,242 B2 | 10/2004 | Molnar |
| 6,822,282 B2 | 11/2004 | Randazzo |
| 6,822,312 B2 | 11/2004 | Sowlati |
| 6,833,756 B2 | 12/2004 | Ranganathan |
| 6,841,847 B2 | 1/2005 | Sia |
| 6,847,572 B2 | 1/2005 | Lee |
| 6,853,272 B1 | 2/2005 | Hughes |
| 6,876,056 B2 | 4/2005 | Tilmans |
| 6,885,534 B2 | 4/2005 | Ker |
| 6,901,126 B1 | 5/2005 | Gu |
| 6,905,889 B2 | 6/2005 | Lowther |
| 6,909,149 B2 | 6/2005 | Russ |
| 6,927,664 B2 | 8/2005 | Nakatani |
| 6,958,522 B2 | 10/2005 | Clevenger |
| 7,009,252 B2 | 3/2006 | Lin |
| 7,027,276 B2 | 4/2006 | Chen |
| 7,205,612 B2 | 4/2007 | Cai |
| 7,262,069 B2 | 8/2007 | Chung |
| 7,365,627 B2 | 4/2008 | Yen |
| 7,368,761 B1 | 5/2008 | Lai |
| 7,400,523 B2 | 7/2008 | Houston |
| 7,405,642 B1 | 7/2008 | Hsu |
| 7,672,100 B2 | 3/2010 | Van Camp |
| 8,144,540 B2 | 3/2012 | Liaw |
| 2002/0019123 A1 | 2/2002 | Ma |
| 2002/0036545 A1 | 3/2002 | Fridi |
| 2002/0188920 A1 | 12/2002 | Lampaert |
| 2003/0076636 A1 | 4/2003 | Ker |
| 2003/0127691 A1 | 7/2003 | Yue |
| 2003/0183403 A1 | 10/2003 | Kluge |
| 2005/0068112 A1 | 3/2005 | Glenn |
| 2005/0068113 A1 | 3/2005 | Glenn |
| 2005/0087787 A1 | 4/2005 | Ando |
| 2006/0006431 A1 | 1/2006 | Jean |
| 2006/0108694 A1 | 5/2006 | Hung |
| 2006/0267102 A1 | 11/2006 | Cheng |
| 2007/0102745 A1 | 5/2007 | Hsu |
| 2007/0194833 A1* | 8/2007 | Takeyama et al. ............ 327/434 |
| 2007/0210416 A1 | 9/2007 | Hsu |
| 2007/0234554 A1 | 10/2007 | Hung |
| 2007/0246801 A1 | 10/2007 | Hung |
| 2007/0249294 A1 | 10/2007 | Wu |
| 2007/0279966 A1* | 12/2007 | Houston ..................... 365/154 |
| 2007/0296055 A1 | 12/2007 | Yen |
| 2008/0094166 A1 | 4/2008 | Hsu |
| 2008/0185679 A1 | 8/2008 | Hsu |
| 2008/0189662 A1 | 8/2008 | Nandy |
| 2008/0200132 A1 | 8/2008 | Hsu |
| 2008/0299738 A1 | 12/2008 | Hsu |
| 2008/0303623 A1 | 12/2008 | Hsu |
| 2009/0029324 A1 | 1/2009 | Clark |
| 2009/0201625 A1 | 8/2009 | Liao |
| 2010/0271898 A1* | 10/2010 | Wu et al. .................. 365/230.05 |
| 2010/0279484 A1 | 11/2010 | Wang |

\* cited by examiner

MEMORY CELL AND MEMORY CELL ARRAY USING THE SAME

FIELD OF THE INVENTION

The present invention relates to a memory technique field, and more particularly to a memory cell and a memory cell array using the same.

BACKGROUND OF THE INVENTION

FIG. 1 is a schematic circuit view of a conventional memory cell. As shown, the conventional memory cell 10 includes two P-type transistors P1, P2, four N-type transistors N1, N2, N3 and N4, a write word line WWL, a first write bit line WBL and a second write bit line WBLB. In the circuit structure of the memory cell 10 shown in FIG. 1, the N-type transistors N3, N4 both are controlled by the write word line WWL; specifically, both of the N-type transistors N3, N4 are controlled to be turned on by the write word line WWL when the memory cell 10 needs to perform data access. However, turning on the two N-type transistors N3, N4 at a same time may lead the memory cell 10 having a relatively poor antinoise ability; wherein the anti-noise ability is usually measured/illustrated by the static noise margin (SNM).

FIG. 2 is a schematic plot illustrating the static noise margin of the memory cell 10 shown in FIG. 1; wherein the static noise margin is defined by the squares enclosed by two characteristic curves, and the area size of the static noise margin is proportional to the anti-noise ability of the memory cell 10. As shown, the area size of the static noise margin is relatively small due to the conventional circuit structure of the memory cell 10; thus, the conventional memory cell 10 has a relatively poor anti-noise ability and consequently the memory cell may result in errors while performing data access.

SUMMARY OF THE INVENTION

The object of present invention is to provide a memory cell having higher anti-noise ability and consequently being capable of preventing errors from occurring while performing data access.

Another object of present invention is to provide a memory cell array using the aforementioned memory cell.

An embodiment of the present invention provides a memory cell, which includes a first P-type transistor, a second P-type transistor, a first N-type transistor, a second N-type transistor, a third N-type transistor and a fourth N-type transistor. The first P-type transistor is configured to have the first source/drain thereof electrically coupled to a first voltage. The second P-type transistor is configured to have the first source/drain thereof electrically coupled to the first voltage. The first N-type transistor is configured to have the first source/drain thereof electrically coupled to the second source/drain of the first P-type transistor, the second source/drain thereof electrically coupled to a second voltage, and the gate thereof electrically coupled to the gate of the first P-type transistor. The second N-type transistor is configured to have the first source/drain thereof electrically coupled to the second source/drain of the second P-type transistor, the second source/drain thereof electrically coupled to the second voltage, and the gate thereof electrically coupled to the gate of the second P-type transistor. The third N-type transistor is configured to have the first source/drain thereof electrically coupled to a write word line, the second source/drain thereof electrically coupled to the first source/drain of the first N-type transistor and the gate of the second N-type transistor, and the gate thereof electrically coupled to a first write bit line. The fourth N-type transistor is configured to have the first source/drain thereof electrically coupled to the write word line, the second source/drain thereof electrically coupled to the first source/drain of the second N-type transistor and the gate of the first N-type transistor, and the gate thereof electrically coupled to a second write bit line.

Another embodiment of the present invention provides a memory cell array, which includes a plurality of write word lines, a plurality of first write bit lines, a plurality of second write bit lines and a plurality of memory cells. The memory cells are arranged in a matrix form and each one of the memory cells is electrically coupled to one of the write word lines, one of the first write bit lines and one of the second write bit lines. Each one of the memory cells includes a first P-type transistor, a second P-type transistor, a first N-type transistor, a second N-type transistor, a third N-type transistor and a fourth N-type transistor. The first P-type transistor is configured to have the first source/drain thereof electrically coupled to a first voltage. The second P-type transistor is configured to have the first source/drain thereof electrically coupled to the first voltage. The first N-type transistor is configured to have the first source/drain thereof electrically coupled to the second source/drain of the first P-type transistor, the second source/drain thereof electrically coupled to a second voltage, and the gate thereof electrically coupled to the gate of the first P-type transistor. The second N-type transistor is configured to have the first source/drain thereof electrically coupled to the second source/drain of the second P-type transistor, the second source/drain thereof electrically coupled to the second voltage, and the gate thereof electrically coupled to the gate of the second P-type transistor. The third N-type transistor is configured to have the first source/drain thereof electrically coupled to one of the write word lines, the second source/drain thereof electrically coupled to the first source/drain of the first N-type transistor and the gate of the second N-type transistor, and the gate thereof electrically coupled to one of the first write bit lines. The fourth N-type transistor is configured to have the first source/drain thereof electrically coupled to one of the write word lines, the second source/drain thereof electrically coupled to the first source/drain of the second N-type transistor and the gate of the first N-type transistor, and the gate thereof electrically coupled to one of the second write bit lines.

In summary, through controlling the third and fourth N-type transistors to be turned on at different times by the first write bit line and the second write bit line, respectively, the memory cell as well as the memory cell array using the same of the present invention accordingly can have higher antinoise ability and consequently is capable of preventing errors from occurring while performing data access.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 3:
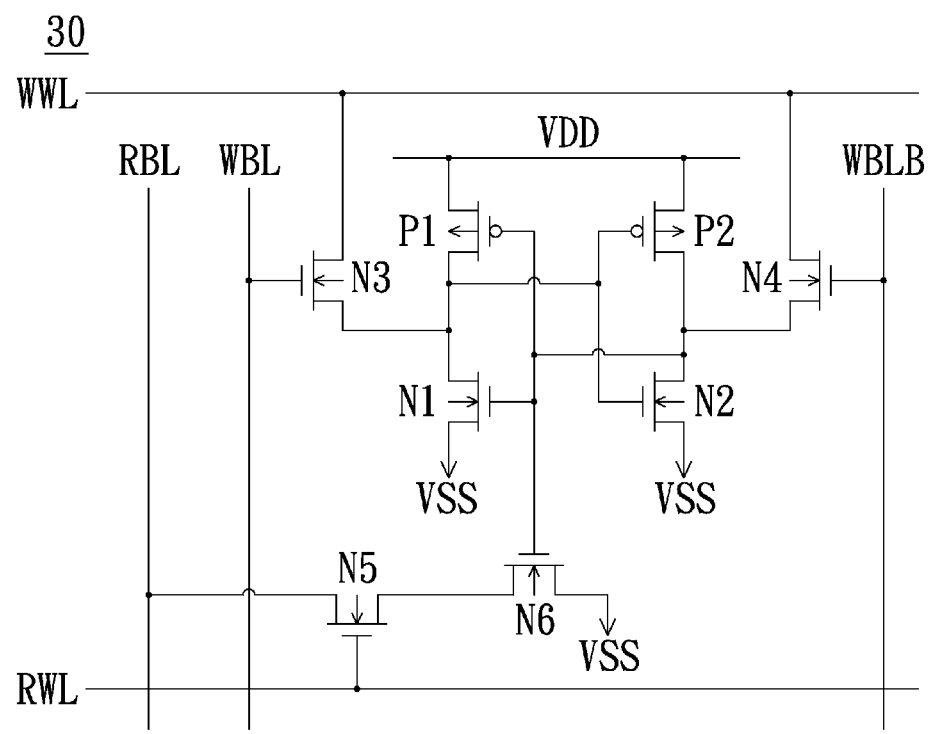
FIG. 3 is a schematic circuit view of a memory cell in accordance with an embodiment of the present invention.
Figure 4:
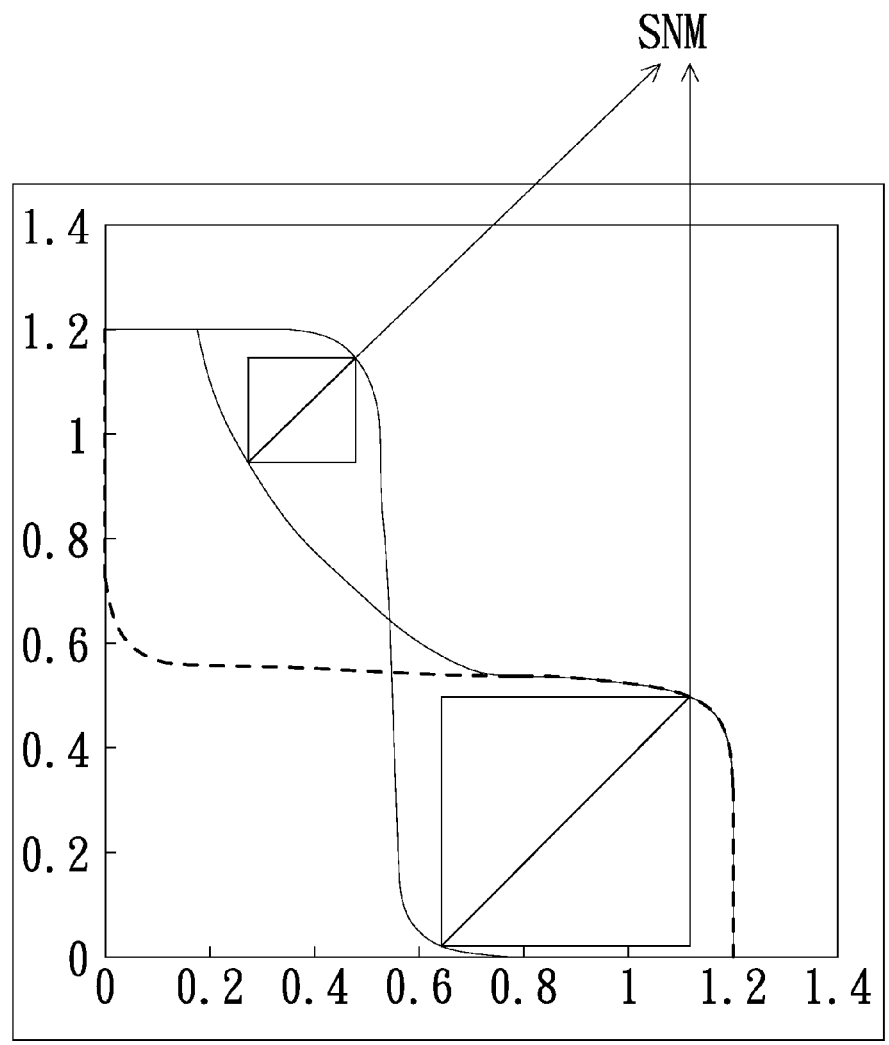
FIG. 4 is a schematic plot illustrating the static noise margin of the memory cell shown in FIG. 3.

FIG. 3 is a schematic circuit view of a memory cell 30 in accordance with an embodiment of the present invention; and FIG. 4 is a schematic plot illustrating the static noise margin of the memory cell 30 shown in FIG. 3. As shown in FIG. 3, the memory cell 30 in this embodiment includes two P-type transistors P1, P2 and six N-type transistors N1, N2, N3, N4, N5 and N6, and some associated signal lines.

Specifically, the P-type transistors P1, P2 each are configured to have the first source/drain thereof electrically coupled to a first voltage VDD. The N-type transistor N1 is configured to have the first source/drain thereof electrically coupled to the second source/drain of the P-type transistor P1, the second source/drain thereof electrically coupled to a second voltage VSS, and the gate thereof electrically coupled to the gate of the P-type transistor P1. The N-type transistor N2 is configured to have the first source/drain thereof electrically coupled to the second source/drain of the P-type transistor P2, the second source/drain thereof electrically coupled to the second voltage VSS, and the gate thereof electrically coupled to the gate of the P-type transistor P2. The N-type transistor N3 is configured to have the first source/drain thereof electrically coupled to a write word line WWL, the second source/drain thereof electrically coupled to the first source/drain of the N-type transistor N1 and the gate of the N-type transistor N2, and the gate thereof electrically coupled to a first write bit line WBL. The N-type transistor N4 is configured to have the first source/drain thereof electrically coupled to the write word line WWL, the second source/drain thereof electrically coupled to the first source/drain of the N-type transistor N2 and the gate of the N-type transistor N1, and the gate thereof electrically coupled to a second write bit line WBLB. The N-type transistor N5 is configured to have the first source/drain thereof electrically coupled to a read bit line RBL, and the gate thereof electrically coupled to a read word line RWL. The N-type transistor N6 is configured to have the first source/drain thereof electrically coupled to the second source/drain of the N-type transistor N5, the second source/drain thereof electrically coupled to the second voltage VSS, and the gate thereof electrically coupled to the gate of the N-type transistor N1. In this embodiment, the first voltage VDD is configured to have a value greater than that of the second voltage VSS. Additionally, in this embodiment, the transistors N3, N4 each are exemplified by an N-type transistor; however, it is understood that the two transistors N3, N4 each can be realized by a P-type transistor in an alternative embodiment.

Figure 1:
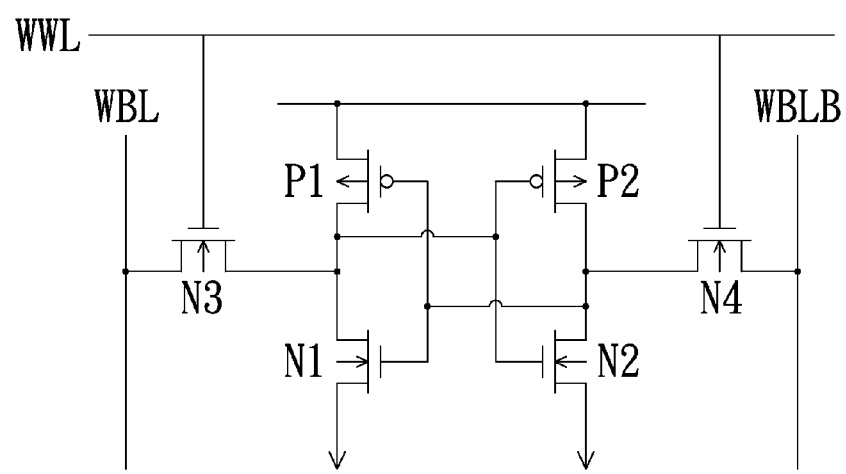
FIG. 1 is a schematic circuit view of a conventional memory cell.
Figure 2:
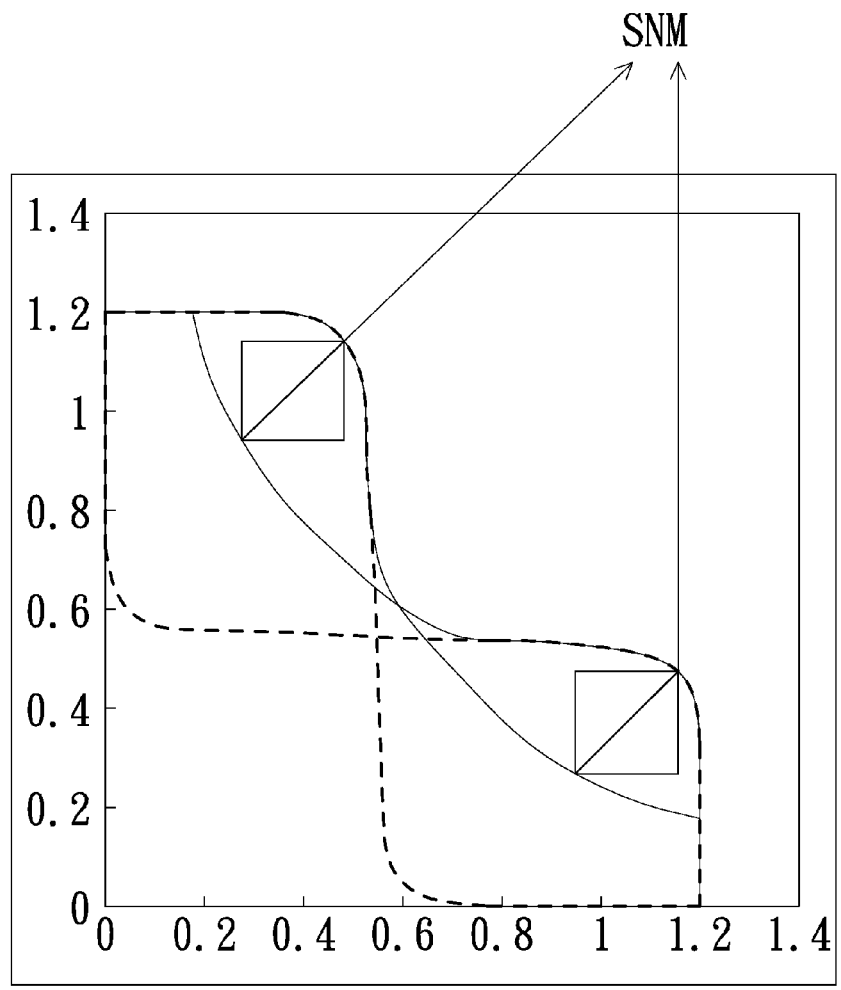
FIG. 2 is a schematic plot illustrating the static noise margin of the memory cell shown in FIG. 1.

According to the circuit structure of the memory cell 30 shown in FIG. 3, the N-type transistors N3, N4 are controlled by the first write bit line WBL and the second write bit line WBLB, respectively; wherein the N-type transistors N3, N4 are configured to be turned-on at different times when the memory cell 30 needs to perform data access. Because the N-type transistors N3, N4 are not both turned on at the same time, only either the transistors associated with the N-type transistor N3 or the transistors associated with the N-type transistor N4 will be affected by the pre-charge voltage of the write bit lines WBL, WBLB or by the external noise from the write bit lines WBL, WBLB. Thus, through configuring the two N-type transistors N3, N4 to be turned on at different times, the static noise margin (SNM) in this embodiment as illustrated in FIG. 4 has an area larger than that of the static noise margin (SNM) of a conventional memory cell as illustrated in FIG. 2. Thus, the memory cell 30 in this embodiment can have higher anti-noise ability and consequently is capable of preventing errors from occurring while performing data access.

Figure 5:
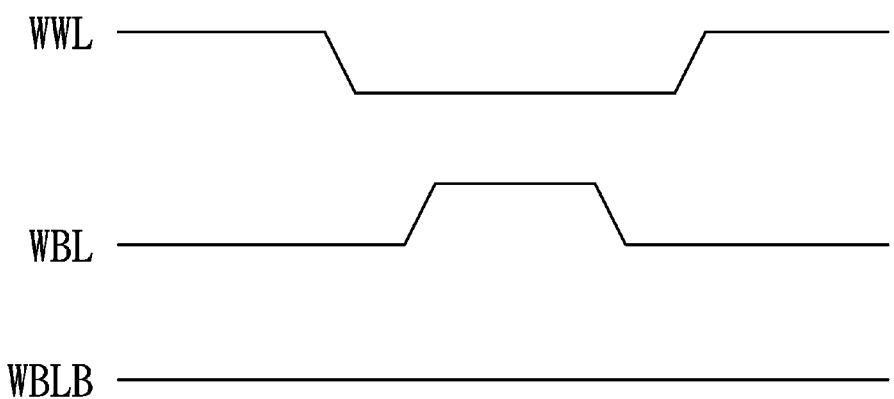
FIG. 5 is a time sequence of the first write bit line, the second write bit line and the write word line.

FIG. 5 is a time sequence of the first write bit line WBL, the second write bit line WBLB and the write word line WWL. As shown, when the first write bit line WBL has a high voltage level thereon and the second write bit line WBLB has a low voltage level thereon, the write word line WWL is configured to have a low voltage level thereon and thereby writing data "0" to the memory cell 30. Moreover, when the first write bit line WBL has a low voltage level thereon and the second write bit line WBLB has a high voltage level thereon, the write word line WWL is configured to have a low voltage level thereon and thereby also writing data "0" to the memory cell 30.

Figure 6:
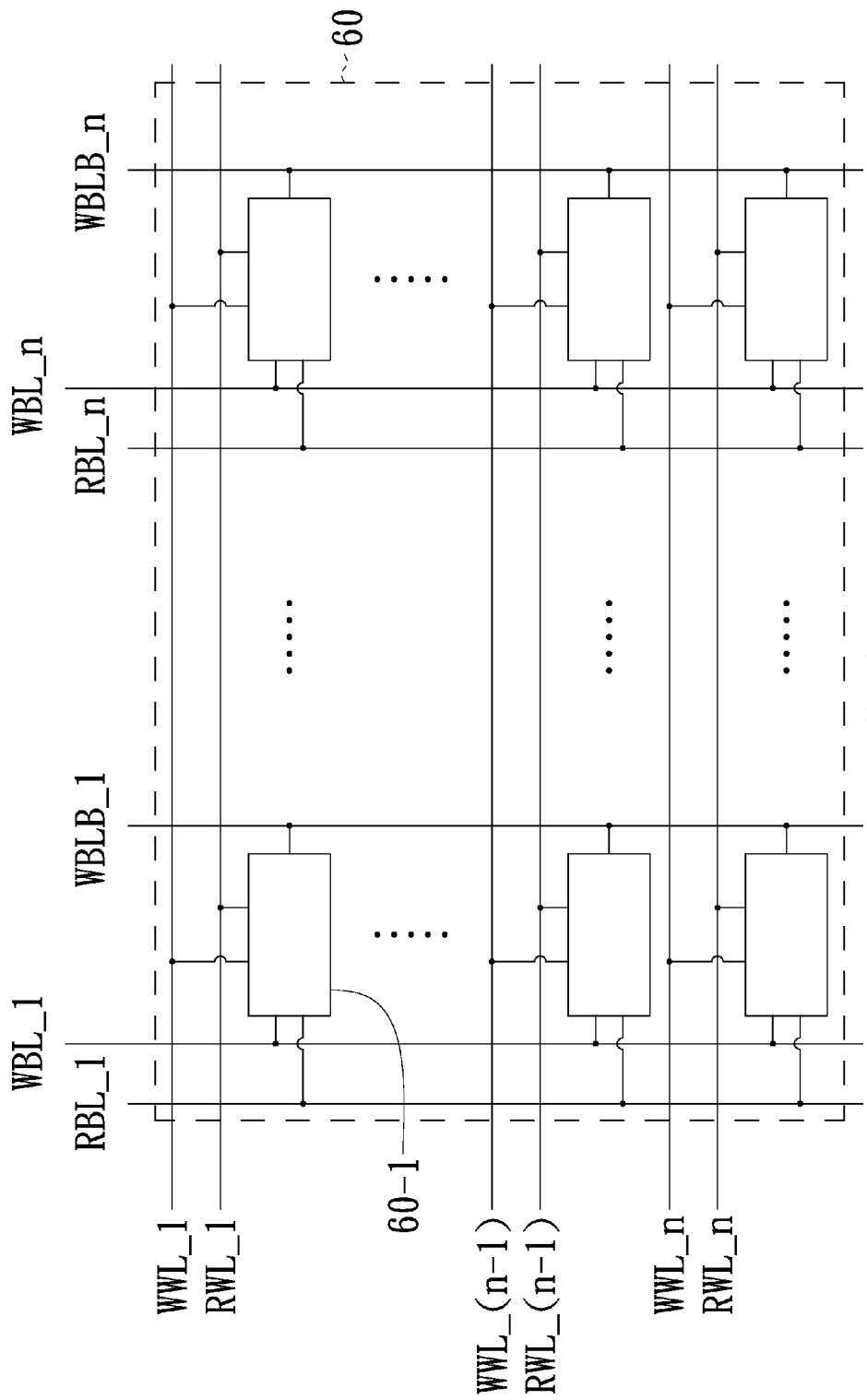
FIG. 6 is a schematic view of a memory cell array in accordance with an embodiment of the present invention.

FIG. 6 is a schematic view of a memory cell array in accordance with an embodiment of the present invention. As shown, the memory cell array 60 in this embodiment includes a plurality of write word lines WWL_1~WWL_n, a plurality of first write bit lines WBL_1~WBL_n, a plurality of second write bit lines WBLB_1~WBLB_n, a plurality of read bit lines RBL_1~RBL_n, a plurality of read word lines RWL_1~RWL_n and a plurality of memory cells 60-1; wherein, each one of the memory cells 60-1 in this embodiment is realized by the circuit structure of the memory cell 30 shown in FIG. 3. Specifically, the memory cells 60-1 are arranged in a matrix form, each of the memory cells 60-1 is electrically coupled to one of the write word lines WWL_1~WWL_n, one of the first write bit lines WBL_1~WBL_n, one of the second write bit lines WBLB_1~WBLB_n, one of the read bit lines RBL_1~RBL_n and one of the read word lines RWL_1~RWL_n. Each of the memory cells 60-1 has a circuit structure and an operation same as that of the memory cell 30 shown in FIG. 3; and no unnecessary detail is given here.

In summary, through controlling the N-type transistors N3, N4 to be turned on at different times by the first write bit line WBL and the second write bit line WBLB, respectively, the memory cell 30 as well as the memory cell array 60 using the same memory cell of the embodiment of the present invention accordingly can have higher anti-noise ability and consequently is capable of preventing errors from occurring while performing data access.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory cell, comprising:
    a first P-type transistor configured to have a first source/drain thereof electrically coupled to a first voltage;

a second P-type transistor configured to have a first source/drain thereof electrically coupled to the first voltage;

a first N-type transistor configured to have a first source/drain thereof electrically coupled to a second source/drain of the first P-type transistor, a second source/drain thereof electrically coupled to a second voltage, and a gate thereof electrically coupled to the gate of the first P-type transistor;

a second N-type transistor configured to have a first source/drain thereof electrically coupled to a second source/drain of the second P-type transistor, the second source/drain thereof electrically coupled to the second voltage, and a gate thereof electrically coupled to the gate of the second P-type transistor;

a third N-type transistor configured to have a first source/drain thereof electrically coupled to a write word line, a second source/drain thereof electrically coupled to the first source/drain of the first N-type transistor and the gate of the second N-type transistor, and the gate thereof electrically coupled to a first write bit line; and a fourth N-type transistor configured to have a first source/drain thereof electrically coupled to the write word line, a second source/drain thereof electrically coupled to the first source/drain of the second N-type transistor and the gate of the first N-type transistor, and a gate thereof electrically coupled to a second write bit line.

2. The memory cell according to claim 1, further comprising:

a fifth N-type transistor configured to have a first source/drain thereof electrically coupled to a read bit line, and a gate thereof electrically coupled to a read word line; and a sixth N-type transistor configured to have a first source/drain thereof electrically coupled to a second source/drain of the fifth N-type transistor, the second source/drain thereof electrically coupled to the second voltage, and a gate thereof electrically coupled to the gate of the first N-type transistor.

3. The memory cell according to claim 1, wherein the first voltage is configured to have a value greater than that of the second voltage.

4. The memory cell according to claim 1, wherein the first write bit line is configured to turn on or turn off the third N-type transistor, the second write bit line is configured to turn on or turn off the fourth N-type transistor.

5. The memory cell according to claim 4, wherein the third and fourth N-type transistors are controlled to be turned on at different times.

6. The memory cell according to claim 4, wherein the write word line is configured to have a low voltage level thereon when the first write bit line has a high voltage level thereon and the second write bit line has a low voltage level thereon.

7. The memory cell according to claim 4, wherein the write word line is configured to have a low voltage level thereon when the first write bit line has a low voltage level thereon and the second write bit line has a high voltage level thereon.

8. The memory cell according to claim 1, wherein each of the third and the fourth N-type transistors is replaced by a P-type transistor.

9. A memory cell array, comprising:
a plurality of write word lines;
a plurality of first write bit lines;
a plurality of second write bit lines; and
a plurality of memory cells arranged in a matrix form, each one of the memory cells being electrically coupled to one of the write word lines, one of the first write bit lines and one of the second write bit lines, each one of the memory cells comprising:

a first P-type transistor configured to have a first source/drain thereof electrically coupled to a first voltage;

a second P-type transistor configured to have a first source/drain thereof electrically coupled to the first voltage;

a first N-type transistor configured to have a first source/drain thereof electrically coupled to a second source/drain of the first P-type transistor, a second source/drain thereof electrically coupled to a second voltage, and a gate thereof electrically coupled to a gate of the first P-type transistor;

a second N-type transistor configured to have a first source/drain thereof electrically coupled to the second source/drain of the second P-type transistor, a second source/drain thereof electrically coupled to the second voltage, and a gate thereof electrically coupled to a gate of the second P-type transistor;

a third N-type transistor configured to have a first source/drain thereof electrically coupled to one of the write word lines, a second source/drain thereof electrically coupled to the first source/drain of the first N-type transistor and the gate of the second N-type transistor, and a gate thereof electrically coupled to one of the first write bit lines; and a fourth N-type transistor configured to have a first source/drain thereof electrically coupled to one of the write word lines, a second source/drain thereof electrically coupled to the first source/drain of the second N-type transistor and the gate of the first N-type transistor, and a gate thereof electrically coupled to one of the second write bit lines.

10. The memory cell array according to claim 9, wherein each one of the memory cells further comprises:

a fifth N-type transistor configured to have a first source/drain thereof electrically coupled to one of the read bit lines, and a gate thereof electrically coupled to one of the read word lines; and a sixth N-type transistor configured to have a first source/drain thereof electrically coupled to a second source/drain of the fifth N-type transistor, the second source/drain thereof electrically coupled to the second voltage, and a gate thereof electrically coupled to the gate of the first N-type transistor.

11. The memory cell array according to claim 9, wherein the first voltage is configured to have a value greater than that of the second voltage.

12. The memory cell array according to claim 9, wherein one of the first write bit lines is configured to turn on or turn off the third N-type transistor, one of the second write bit lines is configured to turn on or turn off the fourth N-type transistor.

13. The memory cell array according to claim 12, wherein the third and fourth N-type transistors are controlled to be turned on at different times.

14. The memory cell array according to claim 12, wherein one of the write word lines is configured to have a low voltage level thereon when one of the first write bit lines has a high voltage level thereon and one of the second write bit lines has a low voltage level thereon.

15. The memory cell array according to claim 12, wherein one of the write word lines is configured to have a low voltage level thereon when one of the first write bit lines has a low voltage level thereon and one of the second write bit lines has a high voltage level thereon.

16. The memory cell array according to claim 9, wherein each of the third and the fourth N-type transistors is replaced by a P-type transistor.

* * * * *